United States Patent [19]

Higashi et al.

[11] Patent Number: 5,126,228
[45] Date of Patent: Jun. 30, 1992

[54] PS PLATE FOR USE IN MAKING LITHOGRAPHIC PRINTING PLATE REQUIRING NO DAMPENING WATER

[75] Inventors: Tatsuji Higashi; Yoshihiko Urabe; Kei Okuno; Nobuyuki Kita, all of Shizuoka, Japan

[73] Assignee: Fuji Photo Film, Co., Ltd., Shizuoka, Japan

[21] Appl. No.: 558,520

[22] Filed: Jul. 27, 1990

Related U.S. Application Data

[63] Continuation-in-part of Ser. No. 490,736, Mar. 8, 1990, abandoned.

[30] Foreign Application Priority Data

Mar. 10, 1989 [JP] Japan .................... 1-58171

[51] Int. Cl.$^5$ .............................................. G03C 1/76
[52] U.S. Cl. .................... 430/272; 430/306; 430/271
[58] Field of Search ................ 430/271 A, 272, 306

[56] References Cited

U.S. PATENT DOCUMENTS

| | | |
|---|---|---|
| 3,894,873 | 7/1975 | Kobayashi et al. . |
| 3,953,212 | 4/1976 | Miyano et al. . |
| 4,086,093 | 4/1978 | Ezumi et al. . |
| 4,342,820 | 8/1982 | Kinashi et al. . |
| 4,743,527 | 5/1988 | Yoshida et al. ............... 430/272 |
| 4,755,445 | 7/1988 | Hesegawa ...................... 430/272 |
| 4,874,686 | 10/1989 | Urabe et al. . |

FOREIGN PATENT DOCUMENTS 2209122 6/1974 France .

Primary Examiner—Jack P. Brammer
Attorney, Agent, or Firm—Burns, Doane, Swecker & Mathis

[57] ABSTRACT

The present invention relates to a presensitized plate for use in making a lithographic plate requiring no dampening water and comprising, on a support, a light-sensitive resin layer and a silicone rubber layer, in this order, wherein the silicone rubber layer is crosslinked by addition reaction of an →SiH group with a —CH=CH— group and wherein the light-sensitive resin layer comprises: (1) a monomer or oligomer having at least one photopolymerizable or photo-crosslinkable and olefinically unsaturated double bond, (2) an organic solvent-soluble polyurethane resin having a glass transition temperature of 20° C. or below and being capable of forming a film, and (3) a photopolymerization initiator. According to the present invention, the PS plate has excellent image-forming properties and printing properties.

14 Claims, No Drawings

PS PLATE FOR USE IN MAKING LITHOGRAPHIC PRINTING PLATE REQUIRING NO DAMPENING WATER

BACKGROUND OF THE INVENTION

The present invention is a continuation-in-part application of Ser. No. 490,736, filed Mar. 8, 1990, now abandoned.

The present invention relates to a presensitized plate (PS plate) for use in making a lithographic printing plate which makes it possible to perform printing without using any dampening water.

Various kinds of presensitized plates for use in making lithographic printing plates which permit printing operation without using any dampening water (hereunder referred to as "water-less PS plate") have been known. In particular, those which comprise, on a substrate, a light-sensitive resin layer and a silicone rubber layer in this order show quite an excellent quality. Examples of such water-less PS plates are disclosed in, for instance, U.S. Pat. No. 3,894,873 and British Patent No. 1,419,643.

The silicone rubber layers commonly employed in these water-less PS plates are those obtained by partially crosslinking with a crosslinking agent, a high molecular weight polymer having a polysiloxane as a principal skeleton. On the other hand, the light-sensitive resin layers for positive-working water-less PS plates include photopolymerizable light-sensitive layer, a photodimerizable light-sensitive resin layer or a diazotype light-sensitive resin layer, which can be cured through exposure to light.

The water-less PS plate having such a layer structure is generally processed as follows, to form images. Namely, the water-less PS plate is exposed to light to cure the lightsensitive resin layer and, if necessary, to cause photoadhesion of the layer to the upper silicone rubber layer at their boundary, whereby both layers are firmly united. As a result, the permeation of a developer and the accompanying dissolution of the light-sensitive resin layer through the silicone rubber layer can be prevented and thus non-image areas composed of the silicone rubber layer are formed. On the other hand, image areas can be formed by penetrating a developer through the silicone rubber layer to dissolve out a part or whole of the unhardened light-sensitive layer and then removing the silicone rubber layer which remains on the unhardened light-sensitive layer by means of a physical force. It is important for obtaining an excellent image-forming ability that the silicone rubber layer is firmly adhered to the light-sensitive resin layer to prevent removal of the non-image area during the development or in the course of the subsequent printing. Various light-sensitive resin layers suitable for this purpose have been proposed. For example, when an allyl methacrylate copolymer described in DE 3811832A is used as a binder, the adhesion of the photopolymerizable light-sensitive resin layer with the silicone rubber layer placed thereon can be secured to a certain extent and excellent image-forming properties can be obtained by suitably selecting the composition of the silicone rubber layer.

However, the allyl methacrylate copolymers have problems that their glass transition temperature is high, that the photo-cured light-sensitive resin layer is rigid and fragile, and that such a layer has poor printing properties.

SUMMARY OF THE INVENTION

The object of the present invention is, therefore, to provide a water-less PS plate having excellent image-forming properties and printing properties.

After intensive investigations made for the purpose of attaining the above-described object, the inventors have found out that a water-less PS plate having both of the above-described properties and comprising, on a support, a light-sensitive resin layer and a silicone rubber layer, in this order, can be obtained by incorporating into the light-sensitive layer, an organic solvent-soluble polyurethane resin having a glass transition temperature of 20° C. or below and being capable of forming a film, as a binder. The present invention has been completed on the basis of this finding.

Namely, the present invention relates to a presensitized plate for use in making a lithographic plate requiring no dampening water and comprising, on a support, a light-sensitive resin layer and a silicone rubber layer, in this order, said rubber layer being crosslinked by addition reaction of an →SiH group with a —CH=CH— group, wherein said light-sensitive resin layer comprises the following components:

(1) a monomer or oligomer having at least one photopolymerizable or photo-crosslinkable and olefinically unsaturated double bond,
(2) an organic solvent-soluble polyurethane resin having a glass transition temperature of 20° C. or below and being capable of forming a film, and
(3) a photopolymerization initiator.

DESCRIPTION OF THE PREFERRED EMBODIMENTS

The water-less PS plate of the present invention is required to have a flexibility high enough to enable the plate to be mounted on an ordinary lithographic press, as well as a strength high enough to withstand load applied thereto during the printing. Typical examples of the substrates are, therefore, coated paper, metal plate such as aluminum plate, plastic films such as polyethylene terephthalate film, rubber and the composite substrates thereof. The substrate can be coated with a coating such as a primer layer in order to prevent halation or for another purpose.

A variety of primer layers can be employed in the present invention for the purposes of enhancing the adhesion between the substrate and the light-sensitive resin layer, of preventing halation, of coloring the resulting images, and of improving printing properties of the resulting lithographic printing plate. As such primer layers, there may be mentioned, for instance, those obtained by exposing a variety of light-sensitive polymers to light to cure, prior to the lamination of the light-sensitive resin layer, as disclosed in Japanese Patent Un-examined Published Application (hereunder referred to as "J. P. KOKAI") No. Sho 60-2290; those obtained by heatsetting an epoxy resin as disclosed in J. P. KOKAI No. Sho 62-50760; those prepared by hardening a gelatin film as disclosed in U.S. Pat. No. 4,861,698; and those obtained by hardening a casein film. In addition, the primer layer may further comprise at least one polymer having a glass transition point of not more than room temperature such as polyurethanes, polyamides, styrene/butadiene rubbers, carboxy-modified styrene/butadiene rubbers, acrylonitrile/butadiene rubbers, carboxylic acid-modified acrylonitrile/butadiene rubbers, polyisoprenes, acrylate rubbers, polyethylenes, chlorinated polyethylenes and chlorinated polypropylenes, in order to make the primer layer flexible. The amount thereof to be added to the primer layer is not critical so far as the formation of the primer layer is ensured. Moreover, the primer layer may comprise other additives, for instance, dyes, pH indicators, agents or compositions for obtaining a visible image immediately after exposure to light, photopolymerization initiators, adhesive aids (such as polymerizable monomers, diazo resins, silane coupling agents, titanate coupling agents or aluminum coupling agents), white pigments and silica powder for achieving the foregoing purposes. The amount of the primer layer to be coated in general ranges from 2 to 20 g/m² (determined after drying).

The light-sensitive resin layer usable in the present invention comprises (1) a monomer or oligomer having at least one photopolymerizable or photo-crosslinkable and olefinically unsaturated double bond, (2) an organic solvent-soluble polyurethane resin having a glass transition temperature of 20° C. or below and being capable of forming film, and (3) a photopolymerization initiator. If necessary, (4) another polymer compound capable of forming a film and soluble in an organic solvent can be also incorporated thereinto.

COMPONENT (1)

Monomer or oligomer having at least one photopolymerizable or photo-crosslinkable and olefinically unsaturated double bond The monomers and oligomers usable in the present invention include, for example, monofunctional acrylates and methacrylates such as polyethylene glycol mono(meth)acrylate, polypropylene glycol mono(meth)acrylate, phenoxyethyl(meth)acrylate, 2-(meth)acryloxyethyl hydrogen phthalate and 2-(meth)acryloxyethyl hydrogen succinate; polyethylene glycol di(meth)acrylate, trimethylolethane tri(meth)acrylate, neopentyl glycol di(meth)acrylate, pentaerythritol tri(meth)acrylate, pentaerythritol tetra(meth)acrylate, dipenta-erythritol hexa(meth)acrylate, hexanediol di(meth)acrylate, trimethylolpropane tri(acryloyloxypropyl) ether, tri-acryloyloxyethyl) isocyanurate, calcium (meth)acrylate, sodium (meth)acrylate, and compounds produced by adding ethylene oxide or propylene oxide to a polyfunctional alcohol such as glycerol or trimethylolethane and then converting the product into its (meth)acrylate; urethane acrylates described in Japanese Patent Publication for Opposition Purpose (hereunder referred to as "J. P. KOKOKU") Nos. 48-41708 and 50-6034 and J. P. KOKAI No. 51-37193; polyester acrylates described in J. P. KOKAI No. 48-64183 and J. P. KOKOKU Nos. 49-43191 and 52-30490; polyfunctional acrylates and methacrylates such as epoxy acrylates prepared by reacting an epoxy resin with (meth)acrylic acid; and N-methylol-acrylamide derivatives described in U.S. Pat. No. 4540649. Further, photocurable monomers and oligomers described on pages 300 to 308 of Journal of the Adhesion Society of Japan, Vol. 20, No. 7 (1984) are also usable. Other compounds usable in the present invention include reaction products of an isocyanate having an allyl group such as allyl isocyanate or

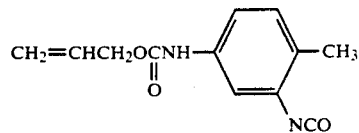

with a hydroxyl group-containing (meth)acrylate compound such as hydroxyethyl (meth)acrylate, hydroxypropyl (meth)acrylate, polyethylene glycol mono(meth)acrylate, polypropylene glycol mono(meth)acrylate, pentaerythritol tri(meth)acrylate, dipentaerythritol tetra(meth)acrylate, CH$_2$=C(R)COOCH$_2$CH(OH)CH$_2$O CH$_2$=C(R)COOCH$_2$CH(OH)CH$_2$O—CH$_2$CH(OH)CH$_2$—O—CH$_2$CH(OH)CH$_2$OOCC(R)=CH$_2$, CH$_2$=C(R)COO—CH$_2$CH(OH)CH$_2$—O—C$_2$H$_4$O—CH$_2$CH(OH)CH$_2$OOCC(R)=CH$_2$, CH$_2$=C(R)COO—CH$_2$CH(OH)CH$_2$-O—CH$_2$CH(CH$_3$)—OCH$_2$CH(OH)CH$_2$OOCC(R)=CH$_2$,

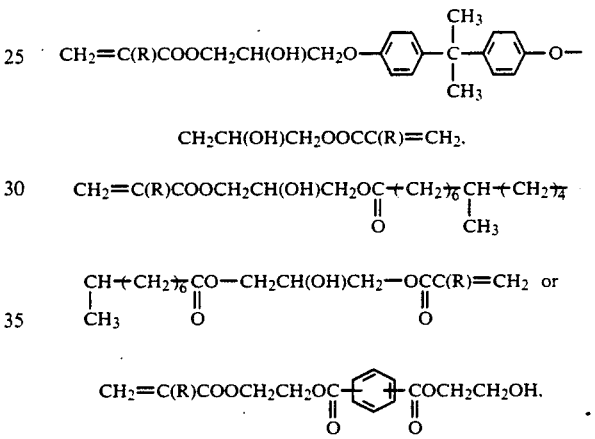

wherein R represents a hydrogen atom or a methyl group; reaction products of a glycidyl ether having an allyl group such as allyl glycidyl ether with a (meth)acrylate compound having a carboxylic acid group such as (meth)acrylic acid, (meth)acryloxyethyl hydrogen phthalate, (meth)acryloxy ethyl hydrogen succinate, (meth)acryloxyethyl hydrogen maleate,(meth)acryloxyethyl hydrogen tetrahydrophthalate or (meth)acryloxyethyl hydrogen hexahydrophthalate; and reaction products of an alcohol having an allyl group such as allyl alcohol or 2-allyloxyethyl alcohol with the above-described (meth)acrylate compound having a carboxylic acid group or its acid chloride group.

COMPONENT (2)

Organic solvent-soluble polyurethane resin having a glass transition temperature of 20° C. or below and being capable of forming a film The above-described polyurethane resins usable in the present invention include those prepared by reacting a diisocyanate with a diol, for example, in substantially equimolar amounts. The diisocyanates include, for example, toluene diisocyanate, xylylene diisocyanate, diphenylmethane diisocyanate, hexamethylene diisocyanate, isophorone diisocyanate, diphenyl ether diisocyanate, hydrogenated xylylene diisocyanate, cyclohexane diisocyanate, hydrogenated diphenylmethane diisocyanate, tetramethylxylene diisocyanate and lysine diisocyanate.

The diols include, for example, polypropylene glycol, polyethylene glycol, polytetramethylene glycol, ethylene oxide/propylene oxide copolymer, tetrahydrofuran/ethylene oxide copolymer, tetrahydrofuran/propylene oxide copolymer, polyesterdiols (such as polyethylene adipate, polydiethylene adipate, polypropylene adipate, polyhexamethylene adipate, polyneopentyl adipate, polyhexamethylene-neopentyl adipate, polyethylene diethylene adipate and polyethylene hexamethylene adipate), poly-ε-caprolactonediol, polyhexamethylene carbonatediol and polytetramethylene adipate. Branched polyurethane resins are also usable. They include compounds formed by replacing a part of or the entire diisocyanate with a trifunctional or higher functional isocyanate compound (such as an adduct of 1 mole of trimethylolpropane with 3 moles of 2,4-toluene diisocyanate; undecane triisocyanate, dicycloheptane triisocyanate or 1,8-diisocyanate-4-isocyanatomethyloctane) and by simultaneously replacing a part of the diol component with a monofunctional monoalcohol [such as allyl alcohol, allyloxyethyl alcohol, hydroxyethyl (meth)acrylate, polyethylene glycol mono(meth)acrylate, polypropylene glycol (meth)acrylate, hydroxypropyl mono(meth)acrylate, benzyl alcohol or ethyl alcohol] to introduce a functional group therein. Further, polyurethane resins having a diol component comprising a special functional group such as an alkyldialkanolamine, (meth)acrylate group-containing diol or a carboxylic acid group-containing diol are also usable. Particularly, a polyurethane resin soluble in an aqueous alkali solution can be obtained by using a diol having a carboxylic acid group as described in J. P. KOKAI Nos. 63-287942 or 63-287943. Such a polyurethane resin is preferred when a water-soluble developer is used.

The polyurethane resin (2) is generally used in an amount of 15~90% by weight, preferably 30~80% by weight, based on the total weight of the light-sensitive resin layer.

COMPONENT (3)

Photopolymerization initiator

The photopolymerization initiators usable in the present invention include, for example, vicinal polyketaldonyl compounds disclosed in U.S. Pat. No. 2,367,660, α-carbonyl compounds disclosed in U.S. Pat. Nos. 2,367,661 and 2,367,670, acyloin ethers disclosed in U.S. Pat. No. 2,448,828, aromatic acyloin compounds substituted with an α-hydrocarbon group and disclosed in U.S. Pat. No. 2,722,512, polynuclear quinone compounds disclosed in U.S. Pat. Nos. 3,046,127 and 2,951,758, a combination of a triaryl imidazole dimer and p-aminophenyl ketone, as disclosed in U.S. Pat. No. 3,549,367, benzothiazole type compounds disclosed in U.S. Pat. No. 3,870,524, benzothiazole type compound/trihalomethyl-s-triazine type compound, as disclosed in U.S. Pat. No. 4,239,850, acridine and phenazine compounds disclosed in U.S. Pat. No. 3,751,259, oxadiazole compounds disclosed in U.S. Pat. No. 4,212,970, trihalomethyl-s-triazine type compounds having a chromophoric group disclosed in U.S. Pat. No. 3,954,475, J. P. KOKAI No. 53-133428, U.S. Pat. No. 4,189,323, J. P. KOKAI Nos. 60-105667 and 62-58241 and Japanese Patent Application No. 61-227489, and peroxyester compounds containing a benzophenone group disclosed in J. P. KOKAI Nos. 59-197401 and 60-76503.

The amount of the photopolymerization initiator used is 0.1 to 20% by weight, preferably 1 to 10% by weight, based on the total light-sensitive resin layer.

COMPONENT (4)

Other polymeric compounds capable of forming a film and other than the component (2)

The other polymeric compounds capable of forming a film and soluble in an organic solvent which are used, if necessary, in the present invention include, for example, methacrylic acid copolymers, acrylic acid copolymers, crotonic acid copolymers, maleic acid copolymers, partially esterified maleic acid copolymers, acidic cellulose derivatives, polyvinyl pyrrolidone, polyethylene oxide, alcohol-soluble nylon, polyesters, unsaturated polyesters, polystyrene, epoxy resin, phenoxy resin, polyvinyl butyral, polyvinyl formal, polyvinyl chloride, polyvinyl alcohol, partially acetalized polyvinyl alcohol, water-soluble nylon, gelatin and water-soluble cellulose derivatives.

The polymeric compounds having a photopolymerizable or photo-crosslinkable and olefinically unsaturated double bond at a side chain include, for example, allyl (meth)acrylate/(meth)acrylic acid/optional another addition-polymerizable vinyl monomer copolymers and alkali metal salts or amine salts thereof, as described in J. P. KOKAI No. 59-53836; reaction products of a hydroxyethyl (meth)acrylate/(meth)acrylic acid/alkyl (meth)acrylate copolymer or alkali metal salts or amine salts thereof with (meth)acryloyl chloride, as described in J. P. KOKOKU No. 59-45979; reaction products obtained by adding pentaerythritol triacrylate to a maleic anhydride copolymer by half-esterification or alkali metal salts or amine salts thereof; reaction products obtained by adding a monohydroxyalkyl (meth)acrylate, polyethylene glycol mono(meth)acrylate or polypropylene glycol mono(meth)acrylate to a styrene/maleic anhydride copolymer by half-esterification or alkali metal salts or amine salts thereof; reaction products of a part of a carboxylic acid of a (meth)acrylic acid copolymer or crotonic acid copolymer with glycidyl (meth)acrylate or alkali metal salts or amine salts thereof, reaction products of a hydroxyalkyl (meth)acrylate copolymer, polyvinyl formal or polyvinyl butyral with maleic anhydride or itaconic anhydride and alkali metal salts or amine salts thereof, reaction products of a hydroxyalkyl (meth)acrylate/(meth)acrylic acid copolymer with 2,4-tolylene diisocyanate/hydroxyalkyl (meth)acrylate (1/1) adduct and alkali metal salts or amine salts thereof; (meth)acrylic acid copolymers partially reacted with allyl glycidyl ether and alkali metal salts or amine salts thereof, as described in J. P. KOKAI No. 59-53836; vinyl (meth)acrylate/(meth)acrylic acid copolymer and alkali metal salts or amine salts thereof; allyl (meth)acrylate/sodium styrenesulfonate copolymer; vinyl (meth)acrylate/sodium styrenesulfonate copolymer; allyl (meth)acrylate/sodium acrylamido-1,1-dimethylethylenesulfonate copolymer, vinyl (meth)acrylate/sodium acrylamido-1,1-dimethylethylenesulfonate, 2-allyloxyethyl methacrylate/methacrylic acid copolymer and 2-allyloxyethyl methacrylate/2-methacryloxyethyl hydrogen succinate copolymer.

The weight ratio of the total of the polymers (2) and (4) to the monomer or abigom (1) is preferably in the range of 99:1 to 30:70, more preferably 97:3 to 50:50.

OTHER COMPONENTS OF THE LIGHT-SENSITIVE RESIN LAYER

The light-sensitive resin layer preferably contains a heat polymerization inhibitor such as hydroquinone, p-methoxyphenol, di-t-butyl-p-cresol, pyrogallol, t-butylcatechol, benzoquinone, 4,4'-thiobis(3-methyl-6-t-butylphenol),2,2'-methylenebis(4-methyl-6-t-butylphenol) and 2-mercapto-benzimidazole. If necessary, a dye or pigment for coloring the light-sensitive resin layer, and a pH indicator or leuco dye as an agent or composition for obtaining a visible image immediately after imagewise exposure may be incorporated in the light-sensitive resin layer. Further, this resin layer may contain a small amount of a silicone compound such as polydimethylsiloxane, methylstyrene-modified polydimethylsiloxane, olefin-modified polydimethylsiloxane, polyether-modified polydimethylsiloxane, silane coupling agent, silicone diacrylate and silicone dimethacrylate. This resin layer may contain a fluorine-containing surfactant or fluorine containing surface-orientating agent which improves its coating properties. This layer may contain also a diazo resin capable of improving the adhesion of the light-sensitive resin layer to the primer layer. The amount of these additives is usually not more than 10% by weight based on the total light-sensitive resin layer. The layer may contain not more than 50% by weight, based on the total light-sensitive resin layer, of a silica powder or hydrophobic silica powder having a surface treated with a silane coupling agent having a (meth)acryloyl group or aryl group.

The components explained in the above are dissolved in a suitable solvent such as 2-methoxyethanol, 2-methoxyethyl acetate, methyl lactate, ethyl lactate, propylene glycol monomethyl ether, methanol, ethanol, methyl ethyl ketone, water or a suitable mixture of them, and then the solution is applied to the surface of the substrate in an amount of about 0.1 to 10 g/m$^2$, preferably 0.5 to 5 g/m$^2$ (on dry basis).

The silicone rubber layer usable in the present invention and wherein the crosslinking is made by addition-reacting an →SiH group with a —CH=CH— group is those obtained by reacting a polyvalent hydrogen organopolysiloxane with a polysiloxane compound having two or more —CH=CH— bonds in a molecule. It is produced preferably by curing and crosslinking a composition comprising the following components:

(1) 100 parts by weight of an organopolysiloxane having at least two alkenyl groups (preferably vinyl groups) directly bonded to silicon atoms in a molecule, (2) 0.1 to 1000 parts by weight of an organohydrogen polysiloxane having at least two →SiH bonds in a molecule, and (3) 0.00001 to 10 parts by weight of an addition catalyst.

The alkenyl group of Component (1) may be at any position of the chain such as its end or its middle position. The organic group other than the alkenyl group includes substituted or unsubstituted alkyl and aryl groups. Component (1) may contain a very small amount of a hydroxyl group. Component (2) forms a silicone rubber layer by its reaction with Component (1) and it also serves as an adhesive for the light-sensitive layer. The hydrogen group of the →SiH group of Component (2) may be at any position such as its end or middle position in the chain. The organic group other than such a hydrogen atom is the same as that of Component (1). It is preferable from the viewpoint of the ink repellency that at least 60 % of the organic groups of Components (1) and (2) comprise methyl groups. The molecular structures of Components (1) and (2) may have linear, cyclic or branched molecular structure. It is preferable from the viewpoint of the physical properties of the rubber that at least one of Components (1) and (2) has a molecular weight of higher than 1,000 and that particularly the molecular weight of Component (1) exceeds 1,000.

Examples of Component (1) include α,ω-divinylpolydimethyl siloxane and methylvinylsiloxane/dimethylsiloxane copolymer having methyl groups at both ends thereof. Examples of Component (2) include polydimethylsiloxane having hydrogen atoms at both ends thereof, α,ω-dimethylpolymethylhydrogen siloxane, methylhydrogen siloxane/dimethylsiloxane copolymer having methyl groups at both ends thereof and cyclic polymethylhydrogensiloxane.

The addition catalyst (3) is selected from known ones. Particularly, platinum type compounds are preferred. Examples of such platinum type compounds include metal platinum, platinum chloride, chloroplatinic acid and platinum coordinated with olefins. The composition for obtaining a silicone rubber layer may further comprise a crosslinking inhibitor such as a vinyl group-containing organopolysiloxane, for instance, tetracyclo(methylvinyl) siloxane, a C-C triple bond-containing alcohol, acetone, methyl ethyl ketone, methanol, ethanol and propylene glycol monomethyl ether, for the purpose of controlling the curing rate of the composition.

The addition reaction takes place and curing is initiated as soon as these three components are admixed together. The curing rate rapidly increases as the reaction temperature is elevated. Therefore, the composition is preferably maintained at a temperature at which the properties of the substrate and the light-sensitive resin layer do not change until the composition is completely cured, for the purposes of extending the pot life of the composition and of shortening the time required for curing the composition on the light-sensitive resin layer. This can further provide highly stable adhesion between the resulting silicone rubber layer and the light-sensitive resin layer.

The composition for the silicone rubber layer may optionally comprise, in addition to the foregoing components, known agents for imparting adhesive properties to the silicone rubber layer such as alkenyl trialkoxysilanes; hydroxyl group-containing organopolysiloxanes which are components of condensation type silicone rubber layers; and/or hydrolyzable functional group-containing silanes (or siloxanes). The composition may also comprise known fillers such as silica for enhancing the strength of the resulting silicone rubber layer.

After plate-making processes, the silicone rubber layer of the water-less PS plate of the present invention serves as an ink repellent layer. Therefore, if the silicone rubber layer is too thin, the ink repellency thereof becomes low and the layer is liable to be injured, while if it is too thick, the developability of the resulting waterless PS plate is impaired. Thus, the thickness of the silicone rubber layer preferably ranges form 0.5 to 5 μm.

The addition type silicone rubber layer to be used in the present invention has merits that it is scarcely influenced by humidity during curing, that it can be cross-linked at a high speed, and that intended properties can be easily obtained. Even when the light-sensitive resin layer contains a carboxylic acid, the addition type silicone rubber layer is sufficiently cured, while the curing of a condensation type silicone rubber layer is inhibited by the crosslinking agent in such a case. Since the light-sensitive resin layer can contain the carboxylic acid, the development with a developer mainly comprising water or an aqueous alkali solution is possible and the designing of the light-sensitive printing plate is easy.

Various additional silicone rubber layers can be formed on the silicone rubber layer of the present water-less PS plate. A bonding layer can be formed between the light-sensitive resin layer and the silicone rubber layer, in order to increase the adhesion between the light-sensitive layer and the silicone rubber layer and to prevent poisoning of the catalyst in the silicone rubber composition. To protect the surface of the silicone rubber layer, the silicone rubber layer may be laminated with a transparent film such as polyethylene, polypropylene, polyvinyl chloride, polyvinylidene chloride, polyvinyl alcohol, polyethylene terephthalate or cellophane, or it may be coated with a polymer.

The water-less PS plate of the present invention is exposed through a transparent original and then the image area (unexposed area) is developed with a developer capable of dissolving or swelling a part or the whole of the light-sensitive resin layer or a developer capable of swelling the silicone rubber layer. In this step, both the light-sensitive resin layer and the silicone rubber layer of the image area are removed or, alternatively, only the silicone rubber layer of the image area is removed. Either way may be selected depending on the strength of the developer.

The developers usable in the present invention are those known as the developers for the water-less PS plates. They include, for example, aliphatic hydrocarbons such as hexane, heptane, 'Isopar E, H or G' (trade names of aliphatic hydrocarbons of Esso Chemicals Inc.), gasoline and kerosene; aromatic hydrocarbons such as toluene and xylene; halogenated hydrocarbons such as trichloroethylene to which the following polar solvent is added; and the following polar solvents per se:

Alcohols (such as methanol, ethanol, propanol, benzyl alcohol, ethylene glycol monophenyl ether, 2-methoxyethanol, 2-ethoxyethanol, carbitol monoethyl ether, carbitol monomethyl ether, triethylene glycol monoethyl ether, propylene glycol monomethyl ether, propylene glycol monoethyl ether, dipropylene glycol monomethyl ether, polyethylene glycol monomethyl ether, propylene glycol, polypropylene glycol, triethylene glycol and tetraethylene glycol), Ketones (such as acetone and methyl ethyl ketone), Esters (such as ethyl acetate, methyl lactate, ethyl lactate, butyl lactate, propylene glycol monomethyl ether acetate, carbitol acetate, dimethyl phthalate and diethyl phthalate), and Others (such as triethyl phosphate and tricresyl phosphate).

It is also possible to use developers obtained by adding water to the foregoing organic solvent type developers and those obtained by solubilizing the foregoing organic solvents in water with the aid of a surfactant or the like, to which an alkaline agent (such as sodium carbonate, monoethanolamine, diethanolamine, triethanolamine, sodium silicate, potassium silicate, sodium hydroxide, potassium hydroxide and sodium borate) may be added; as well as tap water per se or an alkaline water per se.

These developers may comprise a dye such as Crystal Violet or Astrazone Red for the simultaneous coloration of the image areas with the development.

The development of the water-less PS plate of the present invention can be performed in any known manner, for instance, by rubbing the surface of the plate with a developing pad containing a developer or by pouring a developer onto the surface of the plate and then rubbing the plate surface with a developing brush in water. By this, the portions of both the silicone rubber layer and the light-sensitive resin layer are removed from the image areas and as a result, the surface of the substrate or the primer layer is exposed. In this case, the exposed portions serve as ink receiving parts. Alternatively, only the portions of the silicone rubber layer of the image areas can be removed through the foregoing development processing. In this case, the surface of the light-sensitive resin layer is exposed and hence the exposed portions likewise serve as the ink receiving parts.

The water-less PS plate of the present invention is constructed as stated above and therefore the adhesion between the light-sensitive resin layer and the addition type silicone rubber layer is improved, and excellent image-forming properties and printability of the water-less PS plate are ensured.

The following examples will further illustrate the present invention, which by no means limit the present invention.

EXAMPLE 1

A primer layer composition comprising the following components was applied, in an amount of 10 g/m² (on dry basis), to a smooth JIS A 1050 aluminum plate having a thickness of 0.3 mm which had been degreased by an ordinary method, and then heated at 120° C. for 3 min to dry and cure the layer:

| | |
|---|---|
| Milk casein | 48 parts by weight |
| 40% Aqueous glyoxal solution | 5 parts by weight |
| Styrene/butadiene rubber latex | 100 parts by weight |
| (solid content: 50%, Tg of film: −20° C.) | |
| Na$_2$CO$_3$ | 2.6 parts by weight |
| TiO$_2$ | 1 parts by weight |
| CH$_2$—CHCH$_2$OC$_3$H$_6$Si—(OCH$_3$)$_3$ \\O/ (Adhesion aid to the substrate) | 3 parts by weight |

|   | 1.2 parts by weight |
|---|---|

(Structure: quinoline-CH(C(=O))(C(=O))-benzene-SO₃Na with NaO₃S substituent)

(Yellow Dye)

| Pure water | 700 parts by weight |
|---|---|
| $\begin{array}{c} CH_2COOC_6H_{11} \\ | \\ NaO_3S{-}{-}{-}CHCOOC_6H_{11} \end{array}$ (Surfactant) | 0.5 parts by weight |

A light-sensitive resin solution comprising the following components was applied, in an amount of 3 g/m² (on dry basis), to the primer layer provided on the aluminum plate and then dried at 100° C. for 1 min:

| Estane 5715 (polyurethane resin having Tg of −12° C.; a product of Dainippon Ink & Chemicals, Inc.) | 1 part by weight |
|---|---|
| Allyl methacrylate/methacrylic acid (85/15 molar %) copolymer | 1 part by weight |
| $CH_2{=}CHCOO{\text{-}}(CH_2CH_2O)_{\overline{12}}{-}CCH{=}CH_2$  ‖  O | 0.45 part by weight |
| $(CH_2{=}CHCOOCH_2CHCH_2OCH_2)_{\overline{3}}CHOH$  |  OH | 0.45 part by weight |
| (Structure with N, CCl₃ groups and $(C_2H_5OCCH_2)_2N$—) | 0.2 part by weight |
| Bromophenol Blue (pH indicator) | 0.01 part by weight |
| Defenser MCF 323 (a product of Dainippon Ink & Chemicals, Ind.) | 0.02 part by weight |
| PF₆ salt of p-diazodiphenyl-amine/formaldehyde condensate | 0.002 part by weight |
| Propylene glycol monomethyl ether | 15 parts by weight |
| Methyl ethyl ketone | 10 parts by weight |

Then, 2.0 g/m² (on dry basis) of a silicon rubber layer composition comprising the following components was applied to the light-sensitive resin layer and then dried at 140° C. for 2 min to form a cured silicone rubber layer:

| α,ω-Divinylpolydimethyl-siloxane (degree of polymerization: about 700) | 9 parts by weight |
|---|---|
| $CH_3{-}Si(CH_3)_2{-}O{-}(SiO(CH_3))_{\overline{30}}{-}(SiO(H))_{\overline{10}}{-}Si(CH_3)_3$ | 1 part by weight |
| $[CH_2{\text{-}}\underset{O}{\overset{\diagup\diagdown}{\phantom{x}}}\text{-}CHCH_2OC_3H_6(CH_3)SiO](SiO)_3$  with CH₃ and H substituents | 0.2 part by weight |
| Polydimethylsiloxane (degree of polymerization: about 8,000) | 0.5 part by weight |
| Olefin/chloroplatinic acid | 0.2 part by weight |
| Inhibitor | 0.15 part by weight |
| Isopar G (a product of Esso Chemicals Inc.) | 160 part by weight |

A single-side-matted polypropylene film having a thickness of 9 μm was laminated on the thus obtained silicone rubber layer to form a water-less PS plate.

A positive film was placed on the PS plate and exposed for 30 counts, with FT 26 V UDNS ULTRA-PLUS FLIP-TOP PLATE MAKER (a product of Nuarc) and then the positive film was peeled off.

The plate was immersed in a developer comprising 12 parts by weight of benzyl alcohol, 5 parts by weight of sodium isopropylnaphthalenesulfonate, 1 part by weight of triethanolamine and 82 parts by weight of water, for one min and then rubbed with a developing pad to remove both the light-sensitive resin layer and silicone rubber layer of the unexposed area. Thus, the water-less PS plate, on which the image of the positive film was faithfully reproduced all over the surface, was prepared.

The plate thus prepared was used for printing with Heidelberg GTO printing machine, of which a device for feeding dampening water had been dismounted, using TOYO KING ULTRA TUK aquealess G sumi Ink (a product of Toyo Ink Mfg. Co., Ltd.) As a result, prints having faithfully reproduced image and free from greasing were produced.

EXAMPLE 2

A light-sensitive resin layer composition comprising the following components was applied, in an amount of 3.0 g/m² (on dry basis) to the primer layer provided on the aluminum substrate, which was the same as that of Example 1, and then dried at 100° C. for 1 min.

| Allyl methacrylate/tetraethylene glycol monomethacrylate/2-methacryloxyethyl hydrogen succinate (60/30/10 mol) copolymer | 1 part by weight |
|---|---|
| Aqueous alkali solution-soluble polyurethane resin comprising polyesterdiol (comprising 1,6-hexanediol/neopentyl glycol/adipic acid and having a hydroxyl value of 60)/dimethylol-propionic acid/diphenylmethane diisocyanate | 1 part by weight |

-continued

| | |
|---|---|
| (1/1/2 mol)(glass transition temperature: −7° C.) | |
| (CH$_2$=CHCOOCH$_2$CHCH$_2$OCH$_2$)$_{7}$CHOH<br>                \|<br>                OH | 0.6 part by weight |
| Victoria Pure Blue BOH | 0.01 part by weight |
| Defenser MCF 323 (a product of Dainippon Ink & Chemicals, Inc.) | 0.02 part by weight |
| 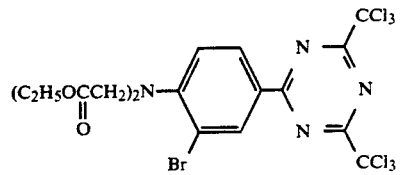 | 0.2 part by weight |
| Propylene glycol monomethyl ether | 15 parts by weight |
| Methyl ethyl ketone | 10 parts by weight |

Then, a silicon rubber layer composition comprising the following components was applied to the light-sensitive resin layer, in an amount of 2.0 g/m² (on dry basis), and dried at 140° C. for 2 min to form a cured silicone rubber layer:

| | |
|---|---|
| Dimethylpolysiloxane having a trivinyl group at both ends (degree of polymerization: about 1,300) | 9 parts by weight |
| 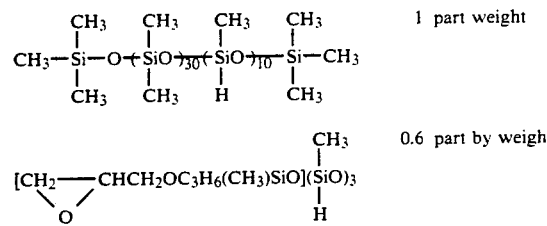 | 1 part weight |
|  | 0.6 part by weight |
| CH$_3$Si(OCCH$_3$)$_3$<br>        \|\|<br>        O | 0.2 part by weight |
| Olefin/chloroplatinic acid | 0.2 part by weight |
| Inhibitor | 0.15 part by weight |
| Isopar G (a product of Esso Chemicals Inc.) | 160 parts by weight. |

A single-side-matted polypropylene film having a thickness of 9 μm was laminated on the thus obtained silicone rubber layer to form a water-less PS plate.

After conducting the exposure and development in the same manner as that of Example 1, a water-less PS plate having excellent image-forming properties was obtained.

EXAMPLE 3

A light-sensitive primer solution having the following composition was applied to a degreased, silicate-treated JIS A 1050 aluminum plate having a thickness of 0.3 mm, in an amount of 4 g/m² (on dry basis), and then dried at 140° C. for 5 min.

| | |
|---|---|
| Polyesterdiol comprising adipic acid/1,6-hexanediol/neopentyl glycol (hydroxyl value: about 60) | 5 parts by weight |

-continued

| | |
|---|---|
| Takenate D-110 N (75% solution) | 1.5 parts by weight |
| (CH$_2$=CHCOOCH$_2$)$_{7}$CC$_2$H$_5$ | 1 part by weight |
| 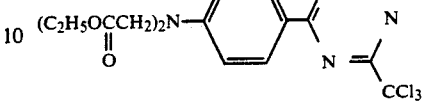 | 0.3 part by weight |
| Victoria Pure Blue BOH | 0.005 part by weight |
| p-Diazodiphenylamine/p-formaldehyde condensate dodecylbenzenesulfonate | 0.02 part by weight |
| Methyl ethyl ketone | 30 parts by weight |
| Propyleneglycol monomethyl ether acetate | 30 parts by weight |
| Defenser MCF 323 (a product of Dainippon Ink & Chemicals. Inc.) | 0.02 part by weight |

Then, a light-sensitive resin layer composition comprising the following components was applied to the primer layer on the aluminum plate in an amount of 3.0 g/m² on (dry basis) and dried at 100° C. for 1 min.

| | |
|---|---|
| Polyurethane resin comprising polyesterdiol (adipic acid/1,6-hexanediol/neopentyl glycol) and isophorone diisocyanate (glass transition temperature: −40° C.) | 2 parts by weight |
| Reaction product of 1 mole of xylenediamine, 2 moles of glycidyl methacrylate and 2 moles of allyl glycidyl ether | 0.6 part by weight |
| CH$_2$=CHCOO(CH$_2$CH$_2$O)$_{12}$CCH=CH$_2$<br>                              \|\|<br>                              O | 0.3 part by weight |
| Fluorine-containing nonionic surfactant | 0.01 part by weight |
| 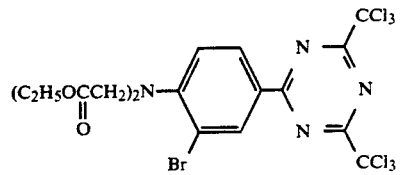 | 0.2 part by weight |
| Propylene glycol monomethyl ether | 15 parts by weight |
| Methyl ethyl ketone | 10 parts by weight |

The same silicon rubber layer composition as that used in Example 2 except that

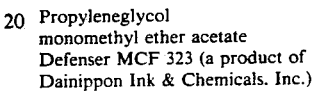

was omitted and applied, in an amount of 2 g/m² (on dry basis), to the light-sensitive resin layer and then dried at 140° C. for 2 min to obtain the cured silicone rubber layer.

A single-side-matted polyethylene terephthalate film having a thickness of 6.5 μm was laminated on the thus obtained silicone rubber layer, to form the water-less PS plate.

The PS plate was exposed to light for 30 counts with the same vacuum exposing apparatus as that used in Example 1. Then, the positive film was peeled off. The plate was immersed in triethylene glycol at 30° C. for 1 min and then rubbed with a developing pad in water to remove the silicone rubber layer of the unexposed part. Thus, the water-less PS on which the image of the positive film was faithfully reproduced all over the surface, was prepared.

What is claimed is:

1. A presensitized plate for use in making a lithographic plate requiring no dampening water and comprising, on a support, a light-sensitive resin layer and a silicone rubber layer, in this order, said silicone rubber layer consisting essentially of silicone rubber which is obtained by the addition reaction of an organopolysiloxane having at least two alkenyl groups directly bonded to silicon atoms in a molecule with an organohydrogen polysiloxane having at least two ≡SiH groups in a molecule in the presence of an addition catalyst, wherein said light-sensitive resin layer comprises, in homogenous admixture, the following components:
   (1) a monomer or oligomer having at least one photopolymerizable or photocrosslinkable and olefinically unsaturated double bond,
   (2) 15-90% by weight, based on the total weight of the light sensitive layer, of an organic solvent-soluble polyurethane resin having a glass transition temperature of 20° C. or below and being capable of forming a film as a binder, and
   (3) a photopolymerization initiator
wherein said light-sensitive resin layer polymerizes and hardens upon exposure to light.

2. The presensitized plate of claim 1 wherein said polyurethane resin (2) is produced from a diisocyanate and a diol.

3. The presensitized plate of claim 2 wherein said diisocyanate is selected from the group of toluene diisocyanate, xylylene diisocyanate, diphenylmethane diisocyanate, hexamethylene diisocyanate, isophorone diisocyanate, diphenyl ether diisocyanate, hydrogenated xylylene diisocyanate, cyclohexane diisocyanate, hydrogenated diphenylmethane diisocyanate, tetramethylxylylene diisocyanate, lysine diisocyanate, and the mixture thereof.

4. The presensitized plate of claim 2 wherein said diol is selected from the group consisting of polypropylene glycol, polyethylene glycol, polytetramethylene glycol, ethylene oxide/propylene oxide copolymer, tetrahydrofuran/ethylene oxide copolymer, tetrahydrofuran/-propylene oxide copolymer, polyesterdiols, poly-ε-caprolactonediol, polyhexamethylene carbonatediol, polytetramethylene adipate, and the mixture thereof.

5. The presensitized plate of claim 4 wherein said polyesterdiol is selected from polyethylene adipate, polydiethylene adipate, polypropylene adipate, polyhexamethylene adipate, polyneopentyl adipate, polyhexamethyleneneopentyl adipate, polyethylene adipate, and poly-ethylene hexamethylene adipate.

6. The presensitized plate of claim 4 wherein said diol has an amine group, a (meth)acrylate group or a carboxylic group.

7. The presensitized plate of claim 1 wherein said polyurethane resin (2) is a branched polyurethane resin.

8. The presensitized plate of claim 1 wherein said polyurethane resin (2) is used in an amount of 15 90% by weight based on the total weight of the light-sensitive resin layer.

9. The presensitized plate of claim 8 wherein said polyurethane resin (2) is used in an amount of 30~80% by weight of the total weight of the light-sensitive resin layer.

10. The presensitized plate of claim 1 wherein said monomer or oligomer (1) is selected from the group consisting of polyethylene glycol mono(meth)acrylate, polypropylene glycol mono(meth)acrylate, phenoxyethyl (meth)acrylate, 2-(meth) acryloxyethyl hydrogen phthalate, 2-(meth)acryloxyethyl hydrogen succinate, polyethylene glycol di(meth)acrylate, trimethylolethane tri(meth)acrylate, neopentyl glycol di(meth)acrylate, pentaerythritol tri(meth)acrylate, pentaerythritol tetra(meth)acrylate, dipentaerythritol hexa(meth)acrylate, hexanediol di(meth)acrylate, trimethylolpropane tri(acryloyloxypropyl) ether, tri(acryloyloxyethyl) isocyanurate, calcium (meth)acrylate, sodium (meth)acrylate, those obtained by adding ethylene oxide or propylene oxide to polyfunctional alcohols selected from glycerol and trimethylolethane and then converting the product into (meth)acrylate, urethane acrylates, polyester acrylates, epoxy acrylates obtained by reacting epoxy resins with (meth)acrylic acids, N-methylol acrylamide derivatives, reaction products of an isocyanate having an allyl group with a hydroxyl group-containing (meth) acrylate, reaction products of a glycidyl ether having an allyl group with a (meth) acrylate having a carboxylic acid group, reaction products of an alcohol having an allyl group with a (meth)acrylate having a carboxylic acid group or its acid chloride group, and the mixtures thereof.

11. The presensitized plate of claim 1 wherein said photopolymerization initiator is selected from the group consisting of vicinal polyketaldonyl compound; α-carbonyl compounds; acyloin ethers; aromatic acyloin compounds substituted with an α-hydrocarbon group; polynuclear quinone compounds; a combination of a triaryl imidazole dimer with p-aminophenyl ketone; benzothiazole type compounds; benzothiazole type compounds/trihalomethyl-s-triazine type compounds; acridine and phenazine compounds; oxadiazole compounds; trihalomethyl-s-triazine type compounds having a chromophoric group; and peroxyester compounds containing a benzophenone group.

12. The presensitized plate of claim 1 wherein said photopolymerization initiator is used in an amount of 0.1 to 20% by weight based on the total weight of the light-sensitive resin layer.

13. The presensitized plate of claim 12 wherein said photopolymerization initiator is used in an amount of 1 to 10% by weight based on the total weight of the light-sensitive resin layer.

14. The presensitized plate of claim 1 wherein said silicone rubber is obtained by the addition reaction of 100 parts by weight of an organopolysiloxane having at least two alkenyl groups directly bonded to silicon atoms in a molecule with 0.1 to 1,000 parts by weight of an organohydrogen polysiloxane having at least two ≡SiH groups in a molecule in the presence of 0.00001 to 10 parts by weight of an addition catalyst.

* * * * *